United States Patent
Meyer et al.

(10) Patent No.: US 10,448,504 B2
(45) Date of Patent: Oct. 15, 2019

(54) METHOD FOR PRODUCING A COMPOSITE MATERIAL

(71) Applicant: Rogers Germany GmbH, Eschenbach (DE)

(72) Inventors: Andreas Meyer, Wenzenbach (DE); Stefan Britting, Schnaittach (DE); Dieter Knöchel, Eckersdorf (DE); David Bierwagen, Schnaittach (DE)

(73) Assignee: ROGERS GERMANY GMBH, Eschenbach (DE)

( * ) Notice: Subject to any disclaimer, the term of this patent is extended or adjusted under 35 U.S.C. 154(b) by 0 days.

(21) Appl. No.: 15/576,424

(22) PCT Filed: May 13, 2016

(86) PCT No.: PCT/EP2016/060896
§ 371 (c)(1),
(2) Date: Nov. 22, 2017

(87) PCT Pub. No.: WO2016/192965
PCT Pub. Date: Dec. 8, 2016

(65) Prior Publication Data
US 2018/0213639 A1    Jul. 26, 2018

(30) Foreign Application Priority Data

Jun. 2, 2015 (DE) .......................... 10 2015 108 668

(51) Int. Cl.
*B23K 1/00* (2006.01)
*H05K 1/03* (2006.01)
*C04B 37/02* (2006.01)

(52) U.S. Cl.
CPC ......... *H05K 1/0306* (2013.01); *C04B 37/026* (2013.01); *C04B 2237/12* (2013.01);
(Continued)

(58) Field of Classification Search
CPC ..... H01L 2224/05647; H01L 2924/014; H01L 23/3735; H01L 24/743; B23K 1/0016;
(Continued)

(56) References Cited

U.S. PATENT DOCUMENTS 3,475,811 A * 11/1969 Clarke .................. B23K 20/04
228/159
3,915,369 A   10/1975 Schmidt-Bruecken et al.
(Continued)

FOREIGN PATENT DOCUMENTS

DE           2213115 A1    9/1973
DE    102005029246 A1   10/2005
(Continued)

OTHER PUBLICATIONS

IPRP for PCT/EP2016/060896, dated Dec. 7, 2017, 5 pages (English translation).
(Continued)

*Primary Examiner* — Erin B Saad
(74) *Attorney, Agent, or Firm* — Cantor Colburn LLP

(57) ABSTRACT

A method for producing a composite material comprising a planar base material to which an additional layer is applied on one side or both sides via a solder layer, characterized by: providing the base material, wherein the base material has a first surface on at least one side; providing the additional layer and arranging the solder layer between a second surface of the additional layer and the first surface such that when the additional layer is deposited on the first surface, the first surface of the base material is covered by the solder layer in a planar manner; wherein a thickness of the solder layer between the base material and the additional layer is smaller than 12 μm; heating the base material and the additional layer on the first surface to at least partially melt the solder layer; and connecting the base material to the at least one additional layer.

15 Claims, 1 Drawing Sheet

(52) U.S. Cl.
CPC .. *C04B 2237/124* (2013.01); *C04B 2237/125* (2013.01); *C04B 2237/126* (2013.01); *C04B 2237/127* (2013.01); *C04B 2237/34* (2013.01); *C04B 2237/343* (2013.01); *C04B 2237/346* (2013.01); *C04B 2237/348* (2013.01); *C04B 2237/365* (2013.01); *C04B 2237/366* (2013.01); *C04B 2237/368* (2013.01); *C04B 2237/402* (2013.01); *C04B 2237/403* (2013.01); *C04B 2237/405* (2013.01); *C04B 2237/406* (2013.01); *C04B 2237/407* (2013.01); *C04B 2237/52* (2013.01); *C04B 2237/708* (2013.01); *C04B 2237/86* (2013.01)

(58) Field of Classification Search
CPC .. B23K 35/0238; B23K 31/02; B23K 35/286; B23K 1/08; B23K 20/04; B23K 35/302; B23K 35/3026; B23K 35/3033; B23K 35/383; H05K 2203/04; H05K 2203/06; H05K 3/202
See application file for complete search history.

(56) References Cited

U.S. PATENT DOCUMENTS

| | | | |
|---|---|---|---|
| 9,579,739 | B2 | 2/2017 | Oohiraki et al. |
| 2005/0214518 | A1 | 9/2005 | Nagase et al. |
| 2005/0266252 | A1* | 12/2005 | Rita ................. C03B 19/06 428/432 |
| 2006/0234482 | A1 | 10/2006 | Ploessl et al. |
| 2008/0118393 | A1* | 5/2008 | Oskarsson ........... B22D 11/008 420/532 |
| 2009/0050920 | A1* | 2/2009 | Nakamura ........... H01L 23/498 257/99 |
| 2010/0032143 | A1 | 2/2010 | Datta et al. |
| 2011/0067908 | A1 | 3/2011 | Weichslberger et al. |
| 2016/0001388 | A1* | 1/2016 | Oohiraki ............... C04B 35/645 228/122.1 |
| 2016/0221305 | A1 | 8/2016 | Terasaki et al. |

FOREIGN PATENT DOCUMENTS

| | | |
|---|---|---|
| EP | 2922090 A1 | 11/2015 |
| JP | 2001203299 A | 7/2001 |
| WO | 0186715 A2 | 11/2001 |
| WO | 2009140709 A2 | 11/2009 |
| WO | 2014136683 A1 | 11/2014 |
| WO | 2015046280 A1 | 4/2015 |

OTHER PUBLICATIONS

International Search Report and Written Opinion of PCT/EP2016/060896, dated Jul. 21, 2016, 14 pages (German).
International Search Report for PCT/EP2016/060896 dated Jul. 14, 2016, 3 pages.
IPRP for PCT/EP2016/060896, dated Sep. 4, 2017 (German).

* cited by examiner

METHOD FOR PRODUCING A COMPOSITE MATERIAL

CROSS-REFERENCE TO RELATED APPLICATION

This application is a national stage application of PCT/EP2016/060896, filed May 13, 2016, which claims priority to Patent Application Number DE 10 2015 108 668.9 filed Jun. 2, 2015, both of which are hereby incorporated by reference in their entirety.

TECHNICAL FIELD

The present invention relates to a method for producing a composite material, in particular for a circuit board as well as a composite material.

BACKGROUND

Composite materials such as circuit boards having additional layers in the shape of metallisations, which are arranged on a ceramic base material, are known in the state of the art in the most various types and are used for purposes in the field of power electronics. Moreover, and as an example, the active soldering method designed to fasten the additional layer on the base material is known from DE 22 13 115. In this method which is specifically also used for producing a metal ceramic substrate, a force-fit connection between a metal foil, for example a copper foil, and a ceramic substrate, for example an aluminium nitride ceramic, by using an appropriate solder material at a temperature from 650 to 1,000° C. In addition to a main component, such as copper, silver and/or gold, the solder material also contains an active metal. Said active metal which is for example at least one element of the group Hf, Ti, Zr, Nb, or Ce, produces a connection between the solder and the ceramic via chemical reaction, while the connection between the solder and the metal is a metal hard solder connection.

In the solder process, the active element forms a reaction layer with the ceramic, which can be sprinkled by the other solder elements during the solder process. Usually, active solders are applied and to the connection partners on the spots where the connection shall be provided, as a paste in which the active element is provided as particles, by serigraphy.

The geometry of the reaction layer, however, resulting from this, entails substrates/composite materials, which are not ideal with respect to their thermal and mechanical properties. Moreover, the method is relatively costly due to its important silver consumption.

Furthermore, the use of rolled solder belts having an active solder composition is also known in the art, but these are not appropriate, either, to remedy the aforementioned disadvantages, as, here, an ideal formation of the reaction layer is not possible, either.

BRIEF SUMMARY

Provided herein is a method for producing a composite material, in particular a circuit board as well as a composite material, which is mechanically and thermally highly stress resistant and less costly.

Further advantages and characteristics of the invention result from the dependant claims as well as from the description and figures attached hereto.

The invention provides for a method for producing a composite material, in particular for a circuit board, wherein the composite material comprises a planar base material, in particular a ceramic, to which an additional layer, in particular a metallisation, is applied on one side or both sides by means of a solder layer, and whereby the method is characterised by the following steps:
  providing the base material, wherein the base material has a first surface on at least one side;
  providing the additional layer and arranging the solder layer between a second surface of the additional layer and the first surface in such a way, in particular by applying the solder layer on at least a second surface of the additional layer, that when the additional layer is deposited on the first surface, the first surface of the base material is covered by the solder layer in a planar manner, in particular in a fully planar manner, wherein a thickness of the solder layer between the base material and the additional layer is smaller than 12 µm, in particular smaller than 7 µm; and
  heating the base material and the additional layer arranged on the first surface to at least partially melt the solder layer and connecting the base material to the at least one additional layer.

In another embodiment, a method for producing a composite material for a circuit board, wherein the composite material comprises a planar base material having a first side and a second side, to which an additional layer is applied on the first side or the first and second sides via a solder layer, comprises:
  providing the base material (1), wherein the base material has a first surface on at least one side;
  providing the additional layer and arranging the solder layer between a second surface (A2) of the additional layer and the first surface so that when the additional layer is deposited on the first surface (A1), the first surface of the base material is covered by the solder layer in a planar manner, wherein a thickness of the solder layer between the base material and the additional layer is smaller than 7 µm;
  wherein an application of the solder layer on the second surface of the additional layer is realised by roll cladding by: first rolling of a solder material to produce a solder wire and application of the solder wire onto the second surface of the additional layer and, second rolling of the additional layer so cladded such that the thickness of the solder layer attains less than 12 µm, in particular less than 7 µm; and
  heating of the base material and of the first additional layer arranged on the first surface to at least partially melt the solder layer and connecting the base material to the at least one additional layer.

Another embodiment is a method for producing a composite material for a circuit board, wherein the composite material comprises a planar ceramic base material having a first side and a second side, to which an additional metal layer is applied on the first side or the first and second sides via a solder layer, wherein the solder layer is an active solder layer comprising Ag, Cu, Sn, Zn and/or In, and active material, and wherein the method comprises:
  providing the ceramic base material, wherein the ceramic base material has a first surface on at least one side;
  providing the additional metal layer and arranging the solder layer between a second surface of the additional metal layer and the first surface so that when the additional metal layer is deposited on the first surface, the first surface of the ceramic base material is covered by the solder layer in a planar manner, wherein a thickness of the solder layer between the base material and the additional layer is smaller than 7 µm, wherein an application of the solder layer on the second surface of the additional metal layer is realised by roll cladding by first rolling of a solder material to produce a solder wire and application of the solder wire onto the second surface of the additional metal layer and second, rolling of the additional metal layer so cladded such that the thickness of the solder layer attains less than 7 µm; and heating of the ceramic base material and of the first additional metal layer arranged on the first surface to at least partially melt the solder layer and connecting the ceramic base material to the at least one additional metal layer.

BRIEF DESCRIPTION OF THE DRAWINGS

The figures show.

DETAILED DESCRIPTION

Figure 1:
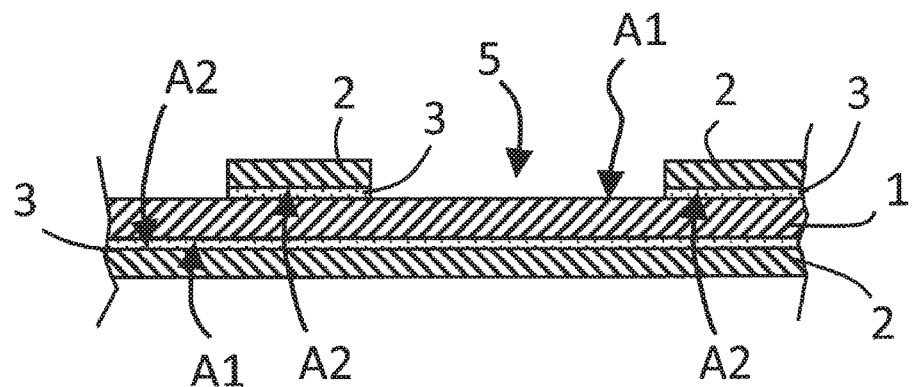
FIG. 1: one sectional view of an embodiment of a composite material.

FIG. 1 shows a base material 1, which comprises a first surface A1 on both sides. Additional layers 2 are fastened via solder layers 3 on the first surfaces A1 of the base material 1, via corresponding second surfaces A2. In one embodiment, the base material 1 exhibits AlN, $Si_3N_4$, SiC, $Al_2O_3$, $ZrO_2$, ZTA (Zirconia Toughened Aluminium Oxide, zirconium dioxide reinforced aluminium oxide), BeO, $TiO_2$, HPS, HPI and/or TiO, respectively is composed of one or a combination of the aforementioned substances/materials. The lower additional layer 2 which, in one embodiment, is a metal layer, for example made of copper, a copper alloy, Mo, W, Ta, Nb, Ni, Fe, Al, an aluminium alloy, steel and/or a titan alloy, is formed without any structuring and is preferably designed for heat conduction respectively heat dissipation. In contrast, the upper additional layer 2 is formed in a structured manner and, as a so-called active layer, generates circuit board tracks, contact surfaces, etc. Due to the extremely thin solder layer 3 which comes to less than 12 µm, in particular to less than 7 µm, said structuring can be realised in a particularly simple manner, for example in the context of a two-step etching method.

Figure 2:
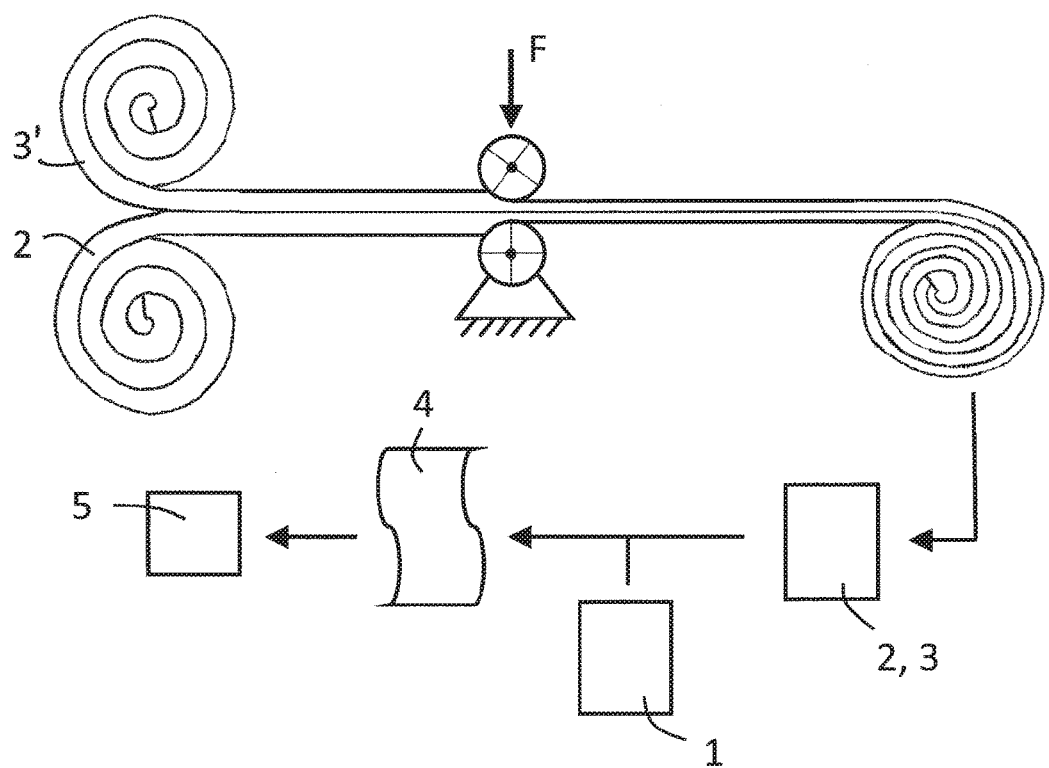
FIG. 2: one functional diagram of one embodiment of the method having a two-step rolling process.

FIG. 2 shows a two-step roll cladding method where a rolled solder belt 3' and an additional layer 2 are connected in the left half of the drawing such that a composite is generated from one solder layer 3 arranged on the additional layer 2 (this step is not explicitly shown in FIG. 2). At this stage, the solder layer 3 still has a thickness ranging above the benchmark value of less than 12 µm, in particular of less than 7 µm. In the medium part of FIG. 2, a second rolling step is outlined, while here the connection between the solder layer 3 and the additional layer 2 can be improved even further by applying a force F (and with the use of heat, if required) and, if required, by slight stretching of the additional layer 2 cladded with the solder layer 3, by 5 to 10% for example. In particular, the multi-step method enables to achieve very thin solder layer thicknesses. The so cladded additional layer 2 can then be rolled-up and be used, if necessary. Hereby, the cladded additional layer 2, 3 is deposited in a planar manner, in particular in a fully planar manner, onto a first surface of the base material 1, to subsequently be soldered in a furnace 4 to become a composite material 5.

The planar, in particular fully planar covering of the first surface of the base material by the solder layer clearly differs from the process known in the art of the serigraphy process or from depositing small solder belts in several sheets. In this respect, we point out that "fully planar" also means that for example, a small border remains on the base material and which does not have any solder layer, wherein said border can amount to up several millimeters, to 2, 3, 5, or 6 mm, for example. Fully planar is to be understood by contrast to an only punctual or partial or an application by portions of the solder layer and to be interpreted such that a fully planar covering shall be given even where a small part of smaller parts/portions of the first surface, for whatever reason, should not be covered.

In the serigraphy process for example, the paste/solder layer is applied only by points respectively on small surfaces or portions, which process unnecessarily raises the costs of material, as due to such process alone, solder layers are applied being too high or too thick on a regular basis. Moreover, this enables to achieve less optimum results due to the thick solder layers generated by such process. Application of solder belts such as known in the state of art, is generally realised by sheets and precisely not in a planar manner, in particular not in a fully planar manner, on the base material. Moreover, application of solder wires is complicated as much attention must be attached to the sheets/solder wires to be precisely adjoined to each other. Where the solder layer sheets overlap, this entails a solder layer which is much too thick in specific points respectively portions and accordingly to poor mechanical properties. Where there is a gap between the solder sheets applied, sprinkling may suffer from this and may result into veritable defect points in the solder layer and the future contacting.

This problem is remedied by the proposed planar, in particular fully planar covering of the base material which in one embodiment has an approximately rectangular shape having one side length of ca. 7.5×11.5 inches. One thickness of the base material of one embodiment ranges from 0.1 to 2.5 mm, preferably from 0.2 to 1 mm.

In one embodiment, the base material features AlN, $Si_3N_4$, SiC, $Al_2O_3$, $ZrO_2$, ZTA (Zirconia Toughened Aluminium Oxide, aluminium oxide by zirconium dioxide reinforced), BeO, $TiO_2$, HPS, HPI, and/or TiOx is made of one of them or of a combination of the aforementioned substances/materials. HPS substrates are produced with zircon doped $Al_2O_3$ ceramic. They are robust and are mostly used in the medium power range. But the use of other ceramics which are not explicitly mentioned here is also possible.

In one embodiment, the additional layer comprises Cu, a Cu alloy, Mo, W, Ta, Nb, Ni, Fe, Al, an aluminium alloy, steel and/or a Ti alloy on one or a combination of the aforementioned substances/materials respectively is made of them. In one embodiment, one thickness of the additional layer ranges from approximately 0.1 to 1 mm, preferably from 0.2 to 0.8 mm.

In order to provide composite materials having optimum mechanical (e.g. with respect to temperature change resistance, stripping and shearing resistance) as well as thermal properties enabling for example good heat dissipation in electronic power modules, the solder layer in the active solder method (AMB, Active Metal Brazing) is formed such that a reaction layer having an appropriate thickness is achieved on the base material. The preferred thickness of the reaction layer is a thickness of approximately 0.01 to 10 μm, more preferably a thickness of approximately 0.05 to 1 μm.

The thickness of the reaction layer is significantly responsible for the mechanical stability of the substrate/the composite material, i.e., the thinner such reaction layer, the better will become the properties of the composite material with respect to its temperature change resistance and its stripping respectively shear resistance. This is due to the brittleness of the reaction layer in the process of being formed, e.g. TiN. Moreover, a certain fraction of the active element remains in the solder layer and, when cooled following the actual soldering process, forms intermetallic phases, such as CuTi or AgTi, which, in turn, negatively affect the ductility of the solder layer, due to a certain brittleness.

In order to enable homogenous reaction layers in the desired thicknesses/sizes, the invention proposes to reduce the thickness of the solder layers to less than 12 μm, in particular to less than 7 μm. A preferred range of the thickness/thickness of size of the solder layer lies between 2 and 5 μm.

In order to generate a thin reaction layer, it would basically also be possible to introduce a smaller content of active elements into the paste used for example for the serigraphy process, whereby then, however, removing the homogenous distribution of the active element based upon particles and thereby the homogenous constitution of a reaction layer. Moreover, production of the very small particles necessary to this end while still having a homogenous particle size distribution can technically be realised only under great difficulties and significant expenditures. In the case of the composite materials/substrates described, the reason for this is a time limit of the liquid state of the solder for a specified hot maintenance temperature during the solder process as, in the case for example of a copper metallisation, copper would continuously be solved in the solder, thus increasing the solidus temperature of the present molten mass.

Due to the reduction of the solder layer thickness to the specified value of less than 12 μm respectively even to less than 7 μm, the invention precisely provides the amount of active elements to the surface, which must be implemented during the solder process in order to generate a homogenous reaction layer, which is durable and stable.

In one embodiment, the solder layer is an active solder layer featuring solder material respectively solder elements, in particular Ag, Cu, Sn, Zn, and/or In respectively a combination of the aforementioned materials. Moreover, the solder layer has active material respectively active elements, in particular Ti, Tr, Hf, Cr, Y, Nb, and/or V.

In one embodiment, the active solder alloy or the solder layer is composed of the metals silver, copper, indium and titan. The solder melts due to a melting point reduced by the copper to silver ratio. According to the application, both metals could be present in the solder in a random ratio, which however would directly impact the solder temperature. Indium (In) or tin (Sn) (0 to 15 wt %) in the solder enlarges the working range/melting range of the solder to lower temperatures than those allowed by the Ag/Cu mixture. Moreover, indium improves sprinkling of surfaces, which are part of the composite. Titan as an active element can be replaced by other elements (metals) which act as active element. Primarily, these are Zr and Hf. However, Y, V, Zr, Nb, can as well be used as active elements, wherein their activation temperature is far above the temperature of titan. Titan content must be adjusted to the surfaces to be connected and ranges from 1 to 10 weight percent in the normal case.

In one embodiment, the specific weight of TiN comes to approximately 5.21 μg/cm$^2$ for a reaction layer thickness of 0.01 μm. In one embodiment, the specific weight of TiN comes to approximately 26.05 μg/cm$^2$ for a reaction layer thickness of 0.05 μm. In one embodiment, the specific weight of TiN comes to approximately 521 μg/cm$^2$ for a reaction layer thickness of 1 μm. In one embodiment, the specific weight of TiN comes to approximately 5210 μg/cm$^2$ for a reaction layer thickness of 10 μm.

Advantageously, the composition of the entire solder layer/solder ally is chosen such that the additional layer/metallisation layer in the presence of a solder temperature ranging from approximately 600 to 700° C. (or even higher, if required), is only slightly melted (ex. g.: copper) or sprinkled by the applied solder layer and the active element being included is entirely separated by the solder melted mass such that it can react with the partner to be added at the solder temperature. When used in appropriate furnaces, the solder process can be realised both in a stack process as well as in continuous furnaces.

The layer thickness must be heated over the entire volume in the range of the solder temperature, irrespective of the solder layer. According to one embodiment, the solder temperature comes to approximately 650 to 1,000° C., preferably to approximately 700 to 950° C., the solder temperature meaning the temperature in the solder layer. Advantageously, one seeks a solder temperature, which is as low as possible.

In one preferred embodiment, one thickness of the solder layer comes to approximately 10 to 30 μm, but preferably less than approximately 7 to 12 μm, for example approximately less than 2 to 10 μm, respectively preferably 2 to 5 μm.

According to one embodiment, a hot maintenance time comes to approximately 10 to 180 min., a solder time to approximately 5 to 160 min. The hot maintenance time then means the temperature set for the furnace. By analogy, the hot maintenance temperature would be the temperature set for the furnace. The solder temperature respectively the solder time is the temperature and the time in the solder layer. Potential atmospheres, where the solder process can take place, comprise or are composed of argon, nitrogen and/or helium.

According to one embodiment, potential furnace types are resistive heating vacuum furnaces having a graphite heater or a metal heater. One possibility is also the use of a resistive heating inert gas furnace as continuous furnaces or even as charge furnaces. According to one embodiment, the invention also provides an inductive heating inert gas furnace as charge furnace. In another embodiment, the invention provides a hot press with inert gas or a vacuum or a hot isostatic press having enclosed laminates.

Potential solder layer compositions are composed as following:

For example, an ideal eutectic and preferred composition comprises 65 to 75 wt % silver (Ag) and 25 to 35 wt % copper (cu). In one embodiment, the ranges also range from 40 to 95 wt % silver (Ag) and 5 to 60 wt % copper (Cu) with solder temperatures of up to 900° C.

One preferred active element is titan. Cr, V, Nb, Y, Ta, Zr, and/or Hf are also usable. Here, the fraction comes to 0.5 to 10 wt %, preferably to 1 to 5 wt %. Sn and/or In are used as additive elements with a fraction of 0 to 15 wt %, preferable approximately 1 to 10 wt %. According to one embodiment, it is therefore also possible to do without the additive element.

Advantageously, the composition of the solder layer respectively of solder material/the solder alloy is chosen such that it is for example appropriate both for the application on the second surface, for example for roll cladding purposes, as well as for the future solder process. In more general terms, the solder layer respectively its alloy composition is used for active soldering purposes for the application in AMB substrates and can simultaneously be used in a roll cladding process.

Another advantage provided by the thin solder layer is the better thermal conductivity of such a composite material. For example, a solder layer of the type contemplated herein offers an inferior thermal conductivity (approximately 70 W/mK) compared to the corresponding pure element, such as for example Cu (390 W/mK) or Ag (429 W/mK). This aspect is of importance in particular as one essential object of the invention is to provide a composite material offering good heat dissipation for the use in electronic power modules.

In one embodiment of the method, application of the solder layer on the second surface of the additional layer is realised by roll cladding. Roll cladding means that the solder layer is rolled onto a carrier using pressure and heat. This creates an inseparable connection by diffusion and pressure welding.

In one embodiment, the solder material/the solder layer to be roll cladded can either be applied on one side directly on the additional layer or on both sides onto a carrier material, such as a separate metal foil (e.g. Cu). This enables significantly thinner solder layers than with a merely rolled solder belt (without carrier material). Where reference is made to the "thickness" of the solder layer, this means a "total thickness" in the case of carrier materials coated on two sides.

In one embodiment, the solder layer is thus provided on a carrier material before it is applied at least to a second surface of the additional layer or even on the first surface of the base material. The carrier material is for example the separate (metal) foil, which is for example made of copper and which is formed such that it can carry, hold and/or support the solder layer. In other word, the carrier material must so to speak enable handling of the solder layer. Advantageously, a solder layer fixed on a carrier material in this way is windable in a coil or a bobbin from which it can then be unrolled for processing as necessary.

In another embodiment, the carrier material is the additional layer, for example the copper foil, where the solder layer has already been fixed respectively arranged on, said copper foil forming the actual metallisation later on.

Irrespective of whether the carrier material is or is not formed by the additional layer, a two-stage roll process is realised in one embodiment, comprising the steps:
first rolling of a solder material to produce a solder belt and application of the solder belt onto the second surface of the additional layer respectively onto a carrier material;
second rolling of the so cladded additional layer/the so cladded carrier material such that the thickness of the solder layer achieves less than 12 μm, in particular less than 7 μm; and
if required, annealing or intermediate annealing or heating between or during the rolling steps, in particular the second rolling step.

In one embodiment, the thickness is reduced during the first rolling step, preferable by 40% relative to the initial thickness of the solder material. The following rolling steps result into a lesser reduction of thickness and are designed to adjust the final thickness. The process is realised such that no ripping off or chipping off of the solder layer occurs.

In one embodiment, the two-sided rolling method is in particular also characterised by the following step:
slight stretching of the cladded additional layer respectively of the cladded carrier material, for example, by approximately 5 to 10% during the rolling process.

This enables further improvement of the connection between the solder layer and the additional layer and in particular further reduction of thickness. In one embodiment, the invention also provides a rolling process having more than two steps, for example 3, 4, 5, 6, 7 or even more steps. Realisation of the method in several steps also offers the advantage that eventually only a very small reduction of thickness under heat conditions must be achieved in each step.

The so cladded and eventually stretched additional layer can then be deposited on the first surface (respectively on one of the first surfaces) in a planar manner, in particular in a fully planar manner. Where, in one embodiment, a carrier material was used, this is deposited on the second surface of the additional layer. Alternatively, it can also be arranged/applied on said surface or one of the first surfaces of the base material. The important point being basically considered with the arrangement is the fact that the reaction layer must always be formed on the side of the base material, i.e., be oriented towards the ceramic. When using the carrier material, this must be removed, if necessary. However, alternatively, such removal could be dispensed with, wherein it can be ensured that the solder method is not negatively impacted thereby. In particular, for a carrier material coated on two sides with solder material, the raw material for the carrier material must be chosen such that one can do without removal of the carrier material.

In one embodiment, the invention also provides a layer structure respectively a sandwich structure where the carrier foil is coated with the active solder respectively the active solder layer on the side oriented to the first surface of the base material, whereas it is coated with a conventional solder on the opposite side, the conventional solder being chosen such that a good solder connection is possible with the additional layer, i.e. the metallisation.

In one embodiment, the invention also provides a combination of the aforementioned methods for applying the solder layer such that the active material is separately applied to one of the surfaces to be joined. Thus, the active element is then no part of the solder material but is separately, for example as powder, applied to one of the surfaces to be joined. The invention significantly reduces the consumption of silver-containing solders as the solder layer thicknesses known in the art generally range between 10 and 30 μm and above. Compared to the methods known from the state of the art, the invention enables to save 10 to 20% silver.

Apart from the cost advantages and the improved mechanical properties already referred to, provided by such a composite material, one should also mention improved corrodibility during the so-called "second etching". In the presence of an aluminium nitride ceramic which is characterised, among others, by a higher thermal conductivity compared to aluminium oxide ceramic, the active solder component combined with the aluminium nitride generates an electrically conducting connection, for example titan nitride, such that the etching process necessary to structure the metallisation must be realised in at least two steps and this in a manner such that in a first etching step ("first etching"), structuring of the metallisation in order to generate circuit boards, contact surfaces, etc. is realised and then, in a second, downstream process step ("second etching"), the electrical conductive material generated between the circuit boards, contact surfaces, etc. via chemical reaction of the active solder component with the aluminium nitride must be removed by etching. Here, the very thin solder layer of less than 12 μm respectively 7 μm facilitates the removal of the solder layer.

The invention also comprises a composite material, in particular a circuit board, produced according to the method of the invention. The advantages and characteristics set out with respect to the production method also apply in analogy to the composite material of the invention, and vice versa.

Additional advantages and characteristics result from the following description of preferred embodiments of the method for producing a composite material respectively the composite material of the invention with reference to the figures attached hereto. Characteristics of the various embodiments can then be combined with each other in the context of the invention.

LIST OF REFERENCE NUMERALS

1 Base material
A1 First surface
2 Additional layer
A2 Second surface
3 Solder layer
3' Solder wire
4 Furnace
5 Composite material

The invention claimed is:

1. A method for producing a composite material for a circuit board,
wherein the composite material comprises a planar base material having a first side and a second side, to which an additional layer is applied on the first side or the first and second sides via a solder layer, wherein the method comprises:
providing the base material, wherein the base material has a first surface on at least one side;
providing the additional layer and arranging the solder layer between a second surface of the additional layer and the first surface so that when the additional layer is deposited on the first surface, the first surface of the base material is covered by the solder layer in a planar manner, wherein a thickness of the solder layer between the base material and the additional layer is smaller than 12 μm, and
heating of the base material and of the additional layer arranged on the first surface to at least partially melt the solder layer and connecting the base material to the at least one additional layer;
wherein the arranging the solder layer is realised by roll cladding by first rolling a solder material and the additional layer to produce a cladded additional layer where the solder layer cladded onto the second surface of the additional layer, and second rolling of the cladded additional layer such that the thickness of the solder layer attains less than 12 μm.

2. The method according to claim 1,
wherein the base material comprises a ceramic.

3. The method according to claim 2,
wherein the base material comprises at least one of AlN, $Si_3N_4$, SiC, $Al_2O_3$, $ZrO_2$, ZTA, BeO, $TiO_2$ and/or $TiO_x$.

4. The method according to claim 1,
wherein the additional layer comprises a metal.

5. The method according to claim 1,
wherein the additional layer comprises at least one of Cu, a Cu-alloy, Mo, W, Ta, Nb, Ni, Fe, Al, an aluminium alloy, steel and/or a Ti alloy.

6. The method according to claim 1,
wherein the solder layer comprises at least one of Ag, Cu, Sn, Zn and/or In, and wherein the solder layer further comprises an active material.

7. The method according to claim 6,
wherein the active material comprises at least one of Ti, Zr, Hf, Cr, Y, Nb, and/or V.

8. The method according to claim 1,
wherein the solder layer is provided on a support material.

9. A method for producing a composite material for a circuit board,
wherein the composite material comprises a planar ceramic base material having a first side and a second side, to which an additional metal layer is applied on the first side or the first and second sides via a solder layer, wherein the solder layer is an active solder layer comprising at least one of Ag, Cu, Sn, Zn and/or In, and active material, and wherein the method comprises:
providing the ceramic base material, wherein the ceramic base material has a first surface on at least one side;
providing the additional metal layer and arranging the solder layer between a second surface of the additional metal layer and the first surface so that when the additional metal layer is deposited on the first surface, the first surface of the ceramic base material is covered by the solder layer in a planar manner, wherein a thickness of the solder layer between the base material and the additional layer is smaller than 7 μm,
wherein an application of the solder layer on the second surface of the additional metal layer is realised by roll cladding by
first rolling of a solder material and the additional layer to produce a cladded additional layer where the solder layer cladded onto the second surface of the additional metal layer and
second rolling of the cladded additional metal layer such that the thickness of the solder layer attains less than 7 μm; and
heating of the ceramic base material and of the additional metal layer arranged on the first surface to at least partially melt the solder layer and connecting the ceramic base material to the at least one additional metal layer.

10. The method according to claim 9,
wherein the ceramic base material comprises at least one of AlN, $Si_3N_4$, SiC, $Al_2O_3$, $ZrO_2$, ZTA, BeO, $TiO_2$ and/or $TiO_x$.

11. The method according to claim 9,
wherein the additional metal layer comprises at least one of Cu, a Cu-alloy, Mo, W, Ta, Nb, Ni, Fe, Al, an aluminium alloy, steel and/or a Ti alloy.

12. The method according to claim 9,
wherein the active material comprises at least one of Ti, Zr, Hf, Cr, Y, Nb, and/or V.

13. The method according to claim 9,
wherein the solder layer is provided on a support material.

14. The method according to claim 9, further comprising slight stretching of the cladded additional layer, wherein the stretching is approximately 5 to 10%.

15. The method according to claim 9,
wherein the ceramic base material comprises at least one of AlN, $Si_3N_4$, SiC, $Al_2O_3$, $ZrO_2$, ZTA, BeO, $TiO_2$ and/or $TiO_x$; and wherein the additional metal layer comprises at least one of Cu, a Cu-alloy, Mo, W, Ta, Nb, Ni, Fe, Al, an aluminium alloy, steel and/or a Ti alloy.

* * * * *